United States Patent
De Caria

(10) Patent No.: US 9,463,617 B2
(45) Date of Patent: Oct. 11, 2016

(54) METHOD AND APPARATUS FOR THE PHOTOPOLYMERIZATION AND THE WASHING IN SERIES OF DIGITAL PRINTING PLATES FOR FLEXOGRAPHY

(71) Applicant: SASU VIANORD ENGINEERING, Carros (FR)

(72) Inventor: Riccardo De Caria, Basiglio (IT)

(73) Assignee: SASU VIANORD ENGINEERING, Carros (FR)

( * ) Notice: Subject to any disclaimer, the term of this patent is extended or adjusted under 35 U.S.C. 154(b) by 0 days.

(21) Appl. No.: 14/395,350

(22) PCT Filed: Apr. 17, 2013

(86) PCT No.: PCT/IB2013/053042
§ 371 (c)(1),
(2) Date: Oct. 17, 2014

(87) PCT Pub. No.: WO2013/156942
PCT Pub. Date: Oct. 24, 2013

(65) Prior Publication Data
US 2015/0114245 A1    Apr. 30, 2015

(30) Foreign Application Priority Data
Apr. 19, 2012 (IT) .............................. MI2012A0652

(51) Int. Cl.
*B41F 33/00* (2006.01)
*B41F 35/00* (2006.01)
*G03F 7/20* (2006.01)

(52) U.S. Cl.
CPC ............. *B41F 35/00* (2013.01); *G03F 7/2004* (2013.01); *G03F 7/2032* (2013.01); *G03F 7/70558* (2013.01)

(58) Field of Classification Search
CPC .............................. G03F 7/3057; B41F 35/00
USPC ........................................................ 101/484
See application file for complete search history.

(56) References Cited

U.S. PATENT DOCUMENTS

| | | | |
|---|---|---|---|
| 3,819,032 A * | 6/1974 | Preuss .................... | B41F 35/00 118/70 |
| 3,981,583 A * | 9/1976 | Tsuchida et al. ............. | 355/100 |
| 4,044,385 A * | 8/1977 | Nishimura et al. ........... | 358/300 |
| 4,707,124 A | 11/1987 | Hickey et al. | |
| 4,876,569 A | 10/1989 | Nishitoku | |

(Continued)

FOREIGN PATENT DOCUMENTS

| CN | 1554986 A | 12/2004 |
|---|---|---|
| CN | 102253602 A | 11/2011 |

(Continued)

OTHER PUBLICATIONS

PCT International Search Report and Written Opinion for PCT/IB2013/053042, mailed Jul. 31, 2013.

*Primary Examiner* — Anthony Nguyen
(74) *Attorney, Agent, or Firm* — LeClairRyan, a Professional Corporation

(57) ABSTRACT

The present invention relates to a method and an apparatus for the photopolymerization and the washing in series of digital printing plates for flexography. The method according to the present invention is characterized in that it implements in series the exposure and washing steps of the printing plate, which is continuously moved. The present invention further concerns an apparatus adapted to implementing said method.

12 Claims, 2 Drawing Sheets

(56) References Cited

U.S. PATENT DOCUMENTS

| | | | | |
|---|---|---|---|---|
| 5,077,176 A | * | 12/1991 | Baggio | G03F 7/3057 134/2 |
| 5,185,625 A | * | 2/1993 | Abe et al. | 355/26 |
| 2001/0003032 A1 | * | 6/2001 | Harada et al. | 430/302 |
| 2006/0230964 A1 | * | 10/2006 | Watanabe et al. | 101/454 |
| 2008/0196609 A1 | * | 8/2008 | Spies | B41J 11/0085 101/142 |
| 2010/0110173 A1 | * | 5/2010 | Kagawa | G01N 21/8983 348/88 |
| 2013/0044300 A1 | | 2/2013 | Mei et al. | |

FOREIGN PATENT DOCUMENTS

| | | |
|---|---|---|
| DE | 3340653 A1 | 5/1985 |
| DE | 19851575 A1 | 5/2000 |
| EP | 0345097 A2 | 12/1989 |
| EP | 1067438 A1 | 1/2001 |
| GB | 2232124 A | 12/1990 |
| WO | 01/76872 A1 | 10/2001 |
| WO | 02/093265 A1 | 11/2002 |
| WO | 2004/051377 A1 | 6/2004 |

* cited by examiner

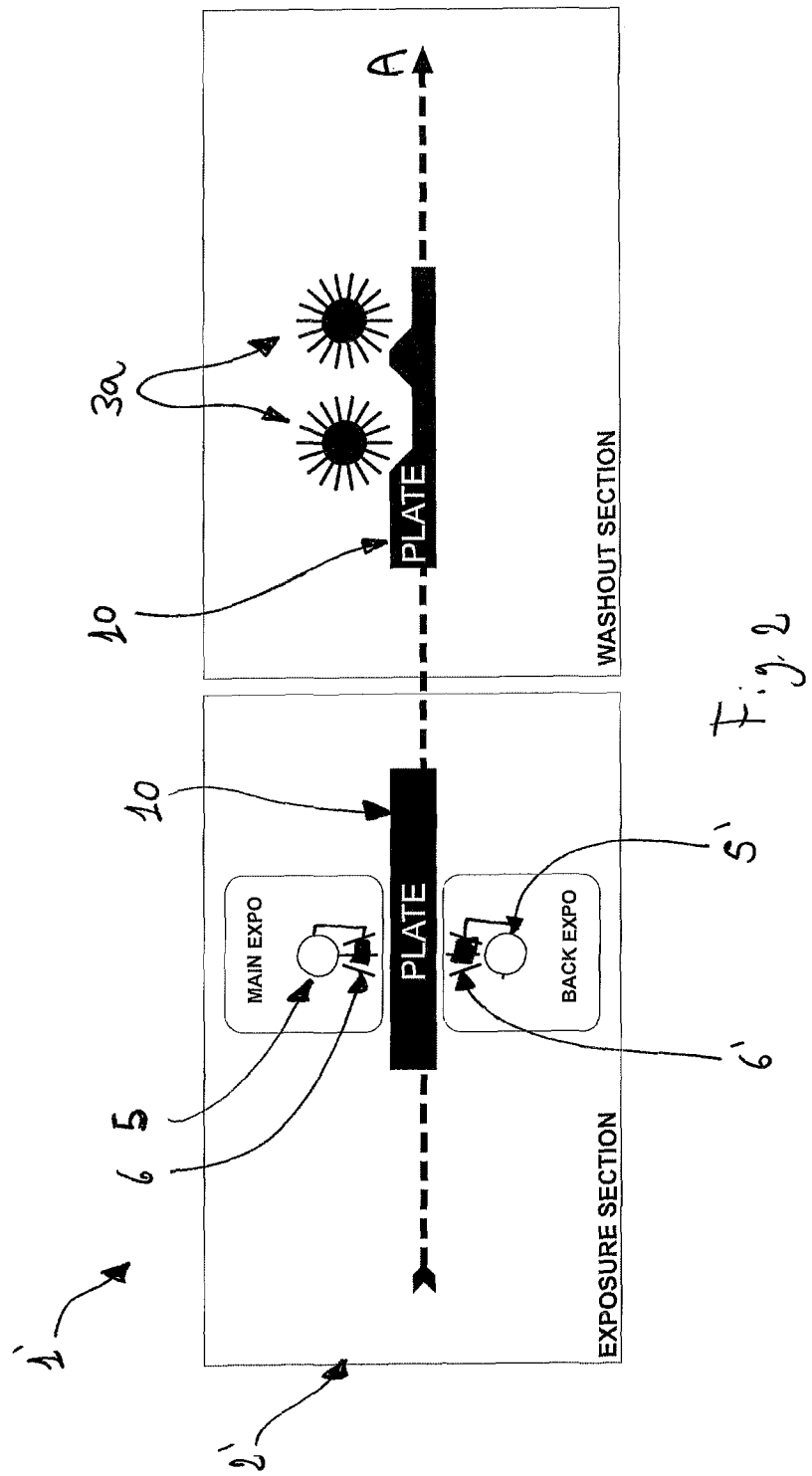

METHOD AND APPARATUS FOR THE PHOTOPOLYMERIZATION AND THE WASHING IN SERIES OF DIGITAL PRINTING PLATES FOR FLEXOGRAPHY

This application is a national stage application under 35 U.S.C. §371 of PCT Patent Application Serial No. PCT/IB2013/053042, filed Apr. 17, 2013, which claims the priority benefit of Italy Patent Application No. MI2012A000652, filed Apr. 19, 2012.

FIELD OF THE INVENTION

The present invention relates to a method for the photopolymerization and the washing in series of printing plates for flexography, as well as an apparatus adapted to implementing said method.

BACKGROUND OF THE INVENTION

Flexography (or flexo) is a direct rotary printing method that uses relief plates made of photopolymer materials. The plates are flexible and soft, hence the name flexography or flexo. These plates are inked and the print is obtained by direct deposition of the ink onto the media to be printed thanks to a light pressure exerted by a printing cylinder on which the plates are placed.

Flexography is a high-speed printing process, capable of printing on many types of absorbent and non-absorbent materials. Some typical applications of flexographic printing are in the manufacture of paper and plastic bags, milk cartons, disposable cups and the like, however thanks to developments in the print quality, flexographic printing is now also used for the printing of newspapers, for example, as well as of envelopes, of labels, and in printing on plastic, films and plates of acetate, wrapping paper and for many materials used in the packaging of products.

As is known, the prepress step, namely the preparation of the flexographic plate which undergoes various steps, among which is the exposure step of the plate to ultraviolet (UV) light for the polymerization thereof, is very important and delicate.

In order to obtain the desired relief characters, the plate is only polymerized at the points of a mask left permeable to the light. In the case of the so-called analogue printing plates, a negative film plate is applied to the plate, which indeed shows the image to be printed in negative, while in the case of the so-called digital printing plates, the plate itself is covered by a layer that is abraded by laser engraving to create the negative of the image to be printed.

The exposure of the plate to light causes the polymerization of only those parts of the plate at the points of the negative film that are permeable to the light, in the case of an analogue printing plate, or at the points in which the layer of coating material has been removed in the case of a digital printing plate, thus forming the image to be printed in relief on the polymer.

In any case, the plate must be exposed to ultraviolet (UV) light for the necessary formation of the base ("back" exposure, i.e. of the bottom or back of the plate). In general, with the known apparatuses of the prior art, the main exposure (i.e. of the main side of the plate) and back exposure steps take place in separate steps of the printing plate treatment process.

Subsequently to the exposure step, the flexographic plate undergoes other processing steps, among which the washing step, thanks to which the unpolymerized material is removed from the plate.

According to what is known in the state of the art, the washing step is performed successively to the exposure step of the plate and using a special washing module. The operator must therefore manually move the printing plate from the exposure module to the washing module, by in general removing the plate from the exposure module and repositioning it at the entrance to the washing module.

The washing of the plate can be performed by means of various known techniques, by means of solvent that penetrates and dissolves the non-photopolymerized polymer or by means of water that detaches, does not dissolve, the non-photopolymerized polymer, and subsequent removal of the non-photopolymerized by means of brushes.

Again, according to what is known in the prior art, the washing step thus provides that the plate be made to slide on a work surface surmounted by a series of brushes set in motion at a pre-determined distance from the work surface. The plate is fed at the speed calculated for optimal removal of the polymer: the greater the engraving thickness of the polymer to be removed, the lower must be the feed speed of the plate in the washing station, and therefore the greater the washing time.

To provide some examples, typical plate thicknesses are for example:

total thickness 1.14 mm, engraving thickness 0.6 mm;
total thickness 6 mm, engraving thickness 3 mm.

The feed speed of the plate in the washing station not only depends on the thickness of the plate, but also on the number of consecutive brushes working the plate during washing.

Again, so as to provide some examples, a plate having a thickness of 1.14 mm can be washed with a feed speed of about 200 mm/min, while a plate having a thickness of 6 mm will be washed at a speed of about 40 mm/min, with a overall washing time that is longer and dependent on the size of the plate.

In consideration of the intrinsic characteristics of the various preparation steps of the printing plate, in particular, the exposure and washing steps considered herein, in the prior art these are carried out, as previously mentioned, in separate machines or modules.

In particular, the printing plate is rested, generally manually, on the surface of an exposure unit and exposed to the light by setting exposure time and radiating power according to what is known from experience. The exposure time does not vary much on variation of the thickness of the plate, while it is dependant on the intensity of the radiated power in the time unit, measured in watts or joules/second. With a flat exposure unit it is possible to perform main and back polymerization in the same module, while other solutions known in the prior art provide that the plate be supported by a roller during the main exposure steps, which naturally makes it impossible to also contemporaneously perform the back exposure of the plate.

The photo polymerized plate is then extracted from the exposure unit; as previously mentioned, this operation is generally performed manually and inserted into the machine or washing station for the subsequent washing operation.

In the sector there is a strong need for the possibility of increasing the speed and efficiency of the preparation steps of the flexographic plate by automating them so that the operator does not need to manually move printing plates that can also be 2 meters to 1.3 meters in size, and so as to have processes suitable for the continuous processing of a large number of printing plates.

SUMMARY OF THE INVENTION

The aim of the present invention is thus to provide a method for the photopolymerization and the washing in series of flexographic printing plates that allows continuous processing of the plates.

Within this aim, the object of the present invention is to provide a method for the photopolymerization and the washing in series of flexographic printing plates, which allows avoidance of the manual movement of the printing plates from the exposure unit to the washing station, with the consequent optimization of processing times and reduction of the work burden on the operators.

It is also the object of the present invention to provide a method for the polymerization and the washing in series of the flexographic printing plates, which allows, in the exposure step, the contemporaneous exposure of the principal main side of the plate and the secondary back side, thus further optimising treatment times.

A further object of the present invention is to provide an apparatus for the photopolymerization and the washing in series of digital printing plates for flexography adapted to implement said method.

This aim and these and other objects will become clearer below are achieved by a method for the photopolymerization and the washing in series of plates for flexography comprising the steps of:
  determining a feed speed of the printing plate according to the washing parameters;
  detecting, by means of a luminosity sensor, the luminous intensity $I_{5R}$ of the light source of the exposure unit;
  comparing, by means of a central control unit, the detected luminous intensity value and the feed speed value with the luminous intensity values as a function of the exposure time preventively stored in the control unit;
  adjusting the luminous intensity of the light source of the exposure unit until the detected luminous intensity is equal to the desired luminous intensity value.

Additionally, these aims and objects are achieved by an apparatus for the photopolymerization and the washing in series of plates for flexography adapted for implementing said method.

In a specific variant of the apparatus for the photopolymerization and the washing in series of plates for flexography suitable for implementing the method of the present invention, said apparatus also being object of the present invention, provides that the exposure step be performed on a bearing surface that allows the contemporaneous exposure of the principal "main" side and of the rear "back" side of the plate.

BRIEF DESCRIPTION OF THE DRAWINGS

Further characteristics and advantages of the present invention shall become clearer from the following detailed description, provided by way of a non-limiting example and illustrated in the accompanying drawings, wherein:

FIG. 2 shows a schematic assembly view of apparatus of the present invention according to one variant, wherein the exposure module allows the contemporaneous exposure of the principal "main" side and of the rear "back" side of the printing plate.

DETAILED DESCRIPTION OF THE INVENTION

Figure 1:
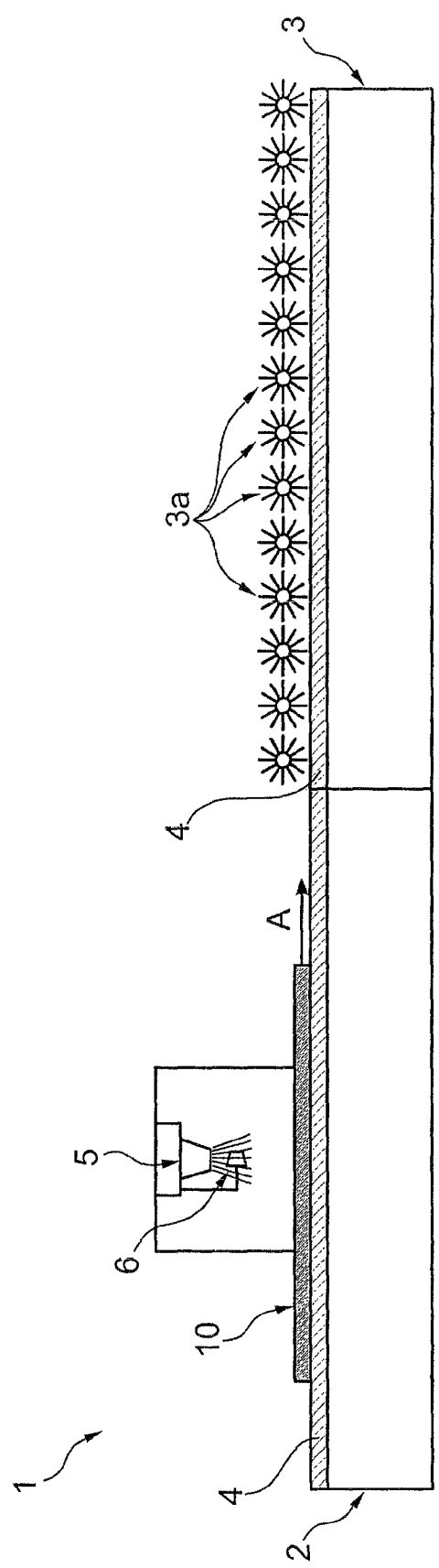
FIG. 1 shows a schematic assembly view of the apparatus according to the present invention, suitable for implementing the method of photopolymerization and washing in series of flexographic printing plates also object of the present invention.

The apparatus 1, also object of the present invention, suitable for implementing the method of photopolymerization and washing in series of flexographic printing plates object of the present invention comprises at least one exposure unit 2 and at least one washing station 3, which comprises a bearing surface of the plate surmounted by a plurality of washing brushes 3a.

Again with reference to the diagram in FIG. 1, the apparatus according to the present invention comprises feed means 4 of the printing plate 10, adapted to feed said plate from said exposure unit 2 towards said washing station 3. The exposure unit 2 and the washing station 3 are therefore arranged in series, with the washing station downstream of the exposure unit when the feed direction of the printing plate 10, indicated in FIG. 1 by the arrow A, is taken into consideration.

The feed means 4 of the printing plate 10 can, for example, include a "pin bar", according to what is known to those skilled in the art.

According to what has been previously described in relation to the exposure and washing processes, it has been explained that the washing step of the plate is influenced by the thickness of the plate. With the same washing station 3 characteristics, such as for example with the same number of brushes 3a, the feed speed $V_a$ of the printing plate is calculated to optimise removal of the polymer: the greater the engraving thickness of the polymer to be removed, the lower must be the feed speed of the plate to the washing station be, and therefore the greater the washing time.

The feed means 4 of the plate thus move the plate 10 with a feed speed $V_a$ determined by the parameters imposed by the washing step. To continuously process the printing plates, it thus becomes fundamental to parametrise the exposure step of the plate that takes place in the exposure unit 2 in consideration of the feed speed $V_a$ that the plate has when it travels through the exposure unit.

For this purpose, the exposure unit 2 comprises a light source 5, shown schematically in FIG. 1 that surmounts the plate 10, at least one luminosity sensor 6 that is suitable for detecting the intensity of the light emitted by the source 5, and at least one control unit suitable for receiving the input signal $I_{5R}$ detected by said luminosity sensor 6 and the value of the feed speed $V_a$ of the printing plate 10, and for comparing these data with the desired $I_{5D}$ value of the luminous intensity emitted by the source 5 preventively calculated as a function of different feed speed values of the plate, so that the same control unit can change the luminous intensity of the source 5 in accordance with these values, bringing the intensity $I_{5R}$ emitted by the source 5 to the desired value $I_{5D}$ value as a function of the feed speed of the plate.

According to a preferred embodiment of the present invention, said light source 5 consists of a plurality of LED lamps aligned along a direction transverse to the feed direction of the plate, indicated by the arrow A in FIG. 1, for a length at least equal to the width of the plate to be processed. According to a preferred embodiment shown purely by way of example, the row of LED lamps will be able to irradiate the plate with a beam of light of about 80 mm in the longitudinal feed direction of the plate. In being fed, the plate 10, moved by feed means 4 in the feed direction A, will be progressively invested by the light emitted by the source 5 at the entire surface thereof.

As concerns the adjustment of the luminous intensity of the source 5, the previously calculated intensity values $I_{5D}$ are stored in the control unit of the apparatus to obtain a correct exposure of the plate in relation to different values of the feed speed $V_a$ of the latter.

For example, if the plate 10 requires an exposure at 8,000 constant joules at each point, and the plate is fed with a feed speed of $V_a$ equal to 100 mm/min, when the feed speed $V_a$ is equal to 300 mm/min, in order to obtain the same exposure of the plate a luminous intensity of 24,000 joules is needed, in that each point of the plate will remain exposed to the light for a time equal to one-third higher with respect to the previous condition.

Known on the basis of experience, the time and the luminous intensity needed for correct polymerization of the plate, these reference values are stored in the memory of the central control unit, which receives as input the values of the parameters relating to the detected luminous intensity $I_{5R}$ of the light that invests the plate 10 and to the feed speed $V_a$ of the plate itself that determines the exposure time, and compares the detected value of intensity $I_{5R}$ with that necessary for correct polymerization, $I_{5D}$, consequently adjusting the luminosity of the source 5.

The method for the photopolymerization and the washing in series of flexographic printing plates according to the present invention therefore comprises the following steps:
- arranging in series an exposure unit 2 and a washing station 3 comprising feed means 4 of the printing plate 10, adapted to move said plate from said exposure unit 2 to said washing station 3;
- determining a feed speed $V_a$ of the printing plate according to the washing parameters;
- detecting, by means of a luminosity sensor 6, the luminous intensity $I_{5R}$ of the light source 5 of the exposure unit;
- comparing, by means of a central control unit, the detected luminous intensity $I_{5R}$ value and the feed speed $V_a$ value with the desired luminous intensity $I_{5D}$ values as a function of the exposure time preventively stored in the control unit;
- adjusting the luminous intensity of the light source 5 of the exposure unit the detected luminous intensity is equal to the desired luminous intensity value ($I_{5R}=I_{5D}$).

The apparatus thus devised allows implementation of the method for the exposure and the washing in series of flexographic printing plates according to the present invention, and further advantages to be obtained.

According to the further variant of the apparatus visible in FIG. 2, the exposure unit 2' comprises a first light source 5 that is located above the feed plane of the plate, and a second light source 5' that is located below the feed plane of the plate. The first light source 5 is adapted to irradiate the principal main side of the plate and a first luminosity sensor 6 is also provided while the second light source 5' is adapted to irradiate the rear back side of the plate and a second luminosity sensor 6' is further provided. According to a preferred embodiment of the present invention, in the variant of FIG. 2, exposure of the main and back sides of the plate 10 occurs contemporaneously, so as to further optimise the exposure process and subsequent washing.

The main advantage of the present invention therefore consists in automation of the exposure and washing processes, in particular with the automated and continuous movement of the printing plates to the washing station, while avoiding manual intervention on the part of the operator, to move the plate from m the exposure unit to the washing unit.

Not only is printing process productivity thus optimised, but further and evident advantages linked to process automation are also obtained, in particular related to the use of labour. It has indeed been said that the apparatuses of the type known in the prior art always provide for a separation of the main and back exposure step and of the plate washing step. An operator must therefore, with the solutions known in the prior art, intervene to manually remove the plate from the exposure unit and place it on the washing machine. In addition to entailing a clear deterioration in the productivity of the preparation process of the flexographic plate for the time necessary to transfer the plate from the exposure unit to the washing machine, the fact that solvent is employed in said washing machine, and that this solvent is evaporated in the drying step that follows the washing is not secondary. There are therefore vapours present around the washing machine that are caused by the solvent, which are harmful to the operator, especially when said operator is called several times a day to operate near the washing machine.

The method and the apparatus for the exposure and the washing in series of flexographic printing plates according to the present invention, by providing for the automated and continuous movement of the printing plates from the exposure unit to the washing station, thus avoiding manual intervention on the part of the operator for the movement of the plate, avoids exposing the operator himself to the highly toxic fumes deriving from the solvent employed in the washing module to which the operator is inevitably exposed in the case of the methods and of the apparatuses of the type known in the prior art.

In addition, a further advantage is represented by the reduction in the spaces necessary. To provide an example, the traditional exposure unit has dimensions, in plan view, of about 2.5 m×3.5 m which, with the space necessary for the movement of the plates becomes about 16 m² against an increase in the space occupied by the washing processor of just 2 m².

Yet a further advantage of the apparatus according to the present invention that is additional to the advantages achieved thanks to the method implemented thereby, consists in that the light source 5 of the exposure unit does not consist of a plurality of lamps suitable for irradiating the entire surface of the printing plate, but can consist, as in the example shown, of a single row of LEDs of a length at least equal to the width of the plate to be processed, or of several rows of paired LEDs. This clearly translates into a greater simplicity of embodiment of the apparatus, i.e. into a greater compactness of the exposure unit.

A further advantage obtained by means of the apparatus according to the present invention consists in that the presence of the luminosity sensor or sensors allows, through the central control unit, the exact monitoring and at any time of the luminous power effectively irradiated by the LED sources. The LED lamps are generally guaranteed for a duration of approximately 20,000 hours, however the presence of the luminosity sensor in the apparatus according to the present invention can be exploited to detect, at any time, the effective efficacies of the light source emitted so as to proceed with the replacement thereof when there is an effective need thereof, and not on the basis of the lamp lifetime estimated by the manufacturer. This allows avoidance of the precocious replacement of lamps that continue to be effective or, conversely, the belated replacement of lamps, thus, compromising the correct polymerization of the plates.

The method and the apparatus described thus far thus allow the continuous processing of the flexographic plates thus increasing the economy of the process while reducing the manual intervention on the part of the operator and more adequately controlling the exposure parameters (in particular by measuring the luminous intensity effectively irradiated by the lamps) and washing parameters.

The automation of the method and apparatus of the present invention have demanded the development, in particular, of the control process of the parameters of the process itself, in particular of the feed speed of the plate, which, as has been said, is determined by the parameters imposed by the washing step, and the adjustment of the parameters of the luminous intensity of the exposure as a function of said feed speed of the plate. Through the method and the apparatus according to the present invention, it is, as has been said, also possible to perform the back exposure of the plate, as illustrated above with reference to FIG. 2.

It has thus been shown that the method and the apparatus according to the present invention allow the proposed aim and objectives to be achieved.

A number of modifications can be made by those skilled in the art without departing from the scope of protection of the present invention, determined by the scope of the claims, which are an integral part of this text and are therefore referenced in their entirety.

The scope of protection of the claims must not thus be restricted to the illustrations or to the preferred embodiments provided by way of example in the description; the claims must instead include all the characteristics of patentable novelty arising from the present invention, including all the characteristics that are deemed equivalent by a person skilled in the art.

The invention claimed is:

1. A method for photopolymerization and washing in series of flexographic printing plates comprising:
    determining, by a control unit, a feed speed for a feed device carrying a printing plate based on a set of washing parameters, the feed device extending through an exposure unit and a washing station arranged in series and positioned to move said printing plate through said exposure unit and said washing station;
    receiving, by the control unit, a luminous intensity of a light source from a luminosity sensor;
    comparing, by a control unit, the detected luminous intensity and the feed speed with desired luminous intensity values as a function of an exposure time; and
    adjusting, by the control unit, the luminous intensity of the light source of the exposure unit until the detected luminous intensity is equal to the desired luminous intensity value.

2. The method as set forth in claim 1 further comprising:
    exposing a main side of the plate and a rear side of the plate contemporaneously.

3. The method as set forth in claim 1, wherein said light source comprises a plurality of lamps aligned along a direction transverse to a feed direction of the plate.

4. The method as set forth in claim 3, wherein said plurality of lamps comprise LED lamps.

5. The method as set forth in claim 1, wherein said feed device comprises a conveyor belt or a roller conveyor.

6. An apparatus for photopolymerization and washing in series of flexographic printing plates, comprising:
    an exposure unit comprising a light source for exposure of a printing plate and one or more luminosity sensors for detecting a luminous intensity emitted by the light source;
    a washing station, arranged in series with the exposure unit;
    a feed device extending through the exposure unit and the washing station, the feed device positioned to move said printing plate through said exposure unit and said washing station at a feed speed based on a set of washing parameters;
    and
    a control unit configured to be capable of adjusting the luminous intensity of the light source as a function of the detected luminous intensity and the feed speed of the feed device.

7. The apparatus as set forth in claim 6, wherein said light source comprises a plurality of lamps aligned along the direction transverse to a feed direction of the feed device.

8. The apparatus as set forth in claim 6, wherein the feed device comprises a conveyor belt or a roller conveyor.

9. The apparatus as set forth in claim 6, wherein said washing station further comprises a plurality of washing brushes.

10. The apparatus as set forth in claim 6, wherein said control unit comprises a memory in which are pre-stored a plurality of desired values of the luminous intensity of the light source corresponding to different feed speeds of the feed device, so that said control unit carries out the comparison between the luminous intensity emitted by the light source detected by the sensor and said desired value of luminous intensity and adjusts the luminosity of the source based on the comparison.

11. The method as set forth in claim 1, wherein the washing station further comprises a plurality of washing brushes.

12. The apparatus as set forth in claim 7, wherein said plurality of lamps comprise LED lamps.

* * * * *